United States Patent [19]

Fox et al.

[11] 4,204,218

[45] May 20, 1980

[54] SUPPORT STRUCTURE FOR THIN SEMICONDUCTOR WAFER

[75] Inventors: William M. Fox; Michael A. Novotny, both of Reading, Pa.

[73] Assignee: Bell Telephone Laboratories, Incorporated, Murray Hill, N.J.

[21] Appl. No.: 882,176

[22] Filed: Mar. 1, 1978

[51] Int. Cl.² ............................................. H01L 29/06
[52] U.S. Cl. ........................................ 357/55; 357/68; 357/69
[58] Field of Search ..................... 357/67, 68, 69, 55

[56] References Cited

U.S. PATENT DOCUMENTS

| 3,335,338 | 8/1967 | Lepselter | 357/69 |
| 3,657,610 | 4/1972 | Yamamoto et al. | 357/69 |
| 4,072,982 | 2/1978 | Stein | 357/69 |

*Primary Examiner*—Edward J. Wojciechowicz
*Attorney, Agent, or Firm*—H. W. Lockhart

[57] ABSTRACT

Semiconductor chips for certain types of devices must be extremely thin, typically less than two mils in thickness. They are therefore extremely fragile and difficult to handle. Such chips are provided with increased strength and rigidity by the addition of a deposited metal frame member on one surface of the chip encompassing the electrode pattern. The frame member has a thickness several times that of the electrode pattern.

3 Claims, 2 Drawing Figures

SUPPORT STRUCTURE FOR THIN SEMICONDUCTOR WAFER

BACKGROUND OF THE INVENTION

This invention relates to semiconductor devices and particularly to the types which are fabricated on extremely thin and fragile semiconductor chips.

Certain types of semiconductor devices, particularly those operating in higher frequency ranges and with appreciable power ratings, are fabricated on extremely thin semiconductor chips typically having thicknesses of about two mils or less. The mil in this case is one-thousandth of an inch and roughly equal to twenty-five microns. Thus the chip thickness of interest in connection with this disclosre is about fifty microns or less. These dimensions are necessitated by the need for close spacing of PN junctions in order to obtain higher frequency performance and by the need to position the high current, heat generating rectifying junction, that is, the collector in a transistor, as close to a heat sink member as possible. Thus, in the case of transistors and even diodes of the high frequency and power type, a bulky semiconductor chip cannot be tolerated because of the increased thermal resistance. Accordingly, it has become the practice in the case of certain microwave power transistors to thin the wafers comprising the transistor chips to a thickness of fifty microns and less where possible. Obviously chips of this thickness are extremely fragile and difficult to process in the chip state. In particular, they are difficult to handle, to apply electrical leads to and to encapsulate.

A thin semiconductor device structure is disclosed in U.S. Pat. No. 3,777,227 wherein a thin web of material is supported by a thick rim of the semiconductor body. Such a web is fabricated by relatively complex and costly masking and etching steps. Moreover, the device disclosed therein utilizes the thick rim portion as an integral part of the electronic structure and is not concerned with heat dissipation.

Thus, an object of this invention is to enhance the strength and rigidity of thin semiconductor bodies facilely and with minimum cost.

Another object of this invention is to enable the fabrication of semiconductor devices in extremely thin chips without undue loss in yield from breakage and cracking. Another object of the invention is to improve the ability to handle such very small thin chips.

SUMMARY OF THE INVENTION

The problem of handling extremely thin semiconductor chips is solved in accordance with this invention by providing a relatively thick reinforcing framework of metal on one surface of the chip to provide increase strength and rigidity. Typically, such a metal frame surrounds the metalization interconnection pattern comprising the electrode connections of the device. The metal frame typically is two or three times as thick as the metalization otherwise applied on the device for making interconnections and in part may be fabricated as a part of the usual metalization process. By a simple mask change the metal frame member may then be built up to increased thickness.

The metal frame is shaped and positioned on the chip so as not to jeopardize the interconnection pattern and to provide maximum support with a minimum addition of material. Generally, the frame member should have the greatest length practicable and should be a closed figure to ensure the maximum enhancement of mechanical strength. In a typical embodiment, on a rectilinear chip, the frame member is a rectilinear strip of suitable width around the periphery of the surface of the chip, thus constituting a complete border thereon.

Advantageously the frame member contains a layer of magnetic material so as to enable handling of the chip during subsequent processing by magnetic means. The frame member has no electrical function with respect to the device and usually is formed on top of whatever dielectric material, such as silicon oxide and silicon nitride, is provided on the chip surface. Thus, a feature of the invention is the fabrication of a strength member of metal without adding critical process steps. In accordance with this invention, it is necessary only to alter the metalization mask to provide for the deposition of the metal frame member during the basic metalization process and to add a simple additional deposition step during which the interconnection pattern is suitably masked while the frame member thickness is increased.

THE DRAWING

The invention and its other objects and features will be better understood from the following detailed description taken in conjunction with the drawing in which FIG. 1 is a cross section of a semiconductor chip, and, FIG. 2 is a plan view of the same chip.

DETAILED DESCRIPTION

Figure 1:
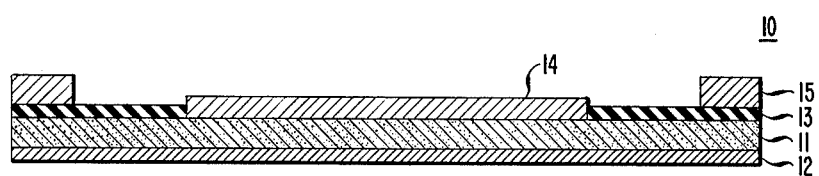
Figure 2:
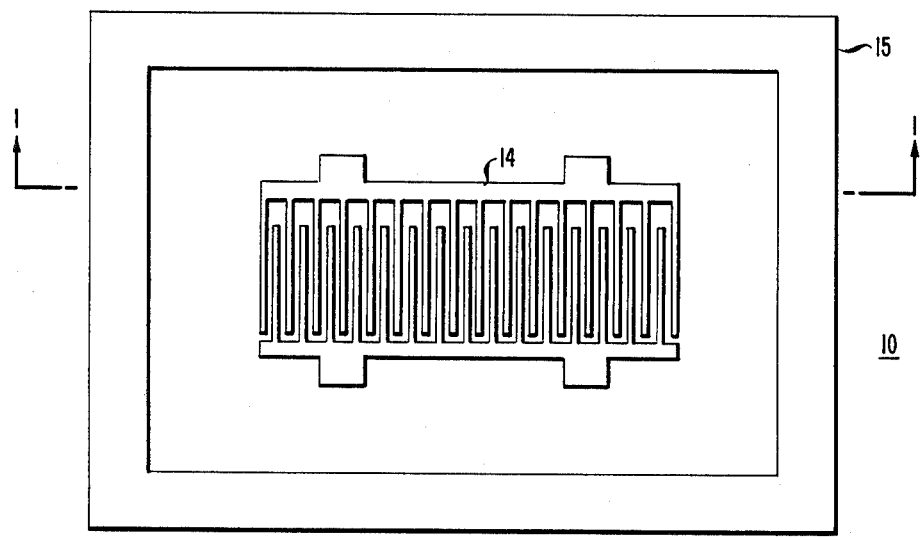

Referring to the drawing, the semiconductor device chip 10 comprises a silicon microwave power transistor. For increased clarity in explaining the invention, certain details, including the conductivity type zones within the silicon body 11 and multiple layers of dielectric films and metal, have not been shown. Referring to the cross section of FIG. 1, which is taken through a header portion of the collector electrode, the transistor comprises a body or chip 11 of single crystal silicon semiconductor material having opposed, major, substantially parallel, surfaces. In a specififc embodiment, a transistor chip may be about 30 mils wide by 40 mils long and be 10 to 20 mils thick before being thinned. On the lower or back surface there is provided a metal layer 12 covering the entire surface. This layer 12 is the electrode constituting the thermal path from the collector junction of the transistor and therefore is mounted ultimately, to the heat sink for dissipating the internal heat generated during operation.

On the upper surface of the device there is provided a conductive electrode pattern 14 having two separate members making contact to the emitter and base zones of the device. The configuration shown is a well-known interdigitated structure and may typically comprise a succession of metal layers or a single metal. As shown particularly in FIG. 1, the remainder of the upper surface of the device is covered with a dielectric film 13, typically consisting of silicon oxide or silicon oxide covered with a separate film of silicon nitride. Overlying the dielectric film 13 is the metal frame member 15 which in this case coincides with the periphery of the chip and is about two to three mils in width. Thus, the frame member is a closed figure of the greatest possible length.

It will be appreciated that the cross-sectional view of FIG. 1 is not to scale and therefore does not enable direct comparison of relative thicknesses. In a specific embodiment the silicon chip 11 is fifty microns thick after being thinned. The metal interconnection pattern 14 comprises three successive metal layers from the silicon surface upward of 0.1 microns titanium, 0.12 microns platinum and 2.0 microns gold, for a total thickness of approximately 2¼ microns. The dielectric film 13 typically has a thickness of less than one micron whether comprising silicon oxide alone or a combination of silicon oxide and nitride. The metal frame member 15 includes the 2½ micron thick multiple metal layers of the interconnection pattern with the addition of a 3.5 micron layer of permalloy covered with a 0.3 micron film of gold for a final total thickness of approximately six microns. It wil be appreciated that all of the device fabrication is done on a semiconductor wafer comprising a large number of chips which are formed by separation of the wafer in accordance with practices well known in the art.

The metal frame member is fabricated with a minimum of alteration of basic process steps. The metalization mask is changed so as to provide for deposition of the frame member outline at the same time that the electrode pattern is deposited. After the titanium, platinum and gold electrode pattern has been formed, the electrode pattern portion of the mask is blanked off and the additional metalization for the frame member, in this case a layer of permalloy followed by a gold film, is deposited. One suitable fabrication procedure using the titanium, platinum, gold combination of metals and achieving the relatively fine spacing required, is disclosed in U.S. Pat. No. 3,808,108 to G. K. Herb and E. F. Labuda, granted Apr. 30, 1974.

The inclusion of the permalloy enables the use of magnetic means for handling the completed chip.

What is claimed is:

1. A semiconductor device comprising a semiconductor chip having two opposed, substantially parallel major surfaces, said chip having a thickness of less than about two mils and having a conductive electrode pattern on one major surface thereof, said conductive electrode pattern having a thickness dimension above said one major surface CHARACTERIZED IN THAT said one major surface includes a metal frame member encompassing said conductive electrode pattern and having a thickness of at least about twice the thickness of said pattern above said surface, said metal frame member constituting a support element providing mechanical strength and rigidity for said chip and having no electrical function relative to said device.

2. A semiconductor device in accordance with claim 1 in which said frame member comprises a deposited metal strip of uniform width.

3. A semiconductor device in accordance with claim 1 in which said frame member adjoins the periphery of said chip.

* * * * *